(12) United States Patent
Ramachandran et al.

(10) Patent No.: US 9,093,462 B2
(45) Date of Patent: Jul. 28, 2015

(54) ELECTROSTATIC DISCHARGE DIODE

(71) Applicant: QUALCOMM Incorporated, San Diego, CA (US)

(72) Inventors: Vidhya Ramachandran, San Diego, CA (US); Brian M. Henderson, Escondido, CA (US); Shiqun Gu, San Diego, CA (US); Chiew-Guan Tan, San Diego, CA (US); Jung Pill Kim, San Diego, CA (US); Taehyun Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/887,723

(22) Filed: May 6, 2013

(65) Prior Publication Data

US 2014/0327105 A1    Nov. 6, 2014

(51) Int. Cl.

| H01L 23/48 | (2006.01) |
|---|---|
| H01L 29/66 | (2006.01) |
| H01L 23/498 | (2006.01) |
| H01L 29/861 | (2006.01) |
| H01L 23/60 | (2006.01) |
| H01L 25/065 | (2006.01) |
| H01L 27/02 | (2006.01) |
| H01L 27/06 | (2006.01) |

(52) U.S. Cl.
CPC ........ *H01L 29/66128* (2013.01); *H01L 23/481* (2013.01); *H01L 23/49827* (2013.01); *H01L 23/60* (2013.01); *H01L 25/0657* (2013.01); *H01L 27/0255* (2013.01); *H01L 27/0296* (2013.01); *H01L 27/0694* (2013.01); *H01L 29/8611* (2013.01); *H01L 2224/0239* (2013.01); *H01L 2224/02372* (2013.01); *H01L 2224/0401* (2013.01); *H01L 2224/0557* (2013.01); *H01L 2224/05548* (2013.01); *H01L 2224/11002* (2013.01); *H01L 2224/13022* (2013.01); *H01L 2224/13024* (2013.01); *H01L 2224/16145* (2013.01); *H01L 2224/94* (2013.01); *H01L 2225/06513* (2013.01); *H01L 2225/06541* (2013.01); *H01L 2924/00014* (2013.01); *H01L 2924/12032* (2013.01)

(58) Field of Classification Search
CPC .............. H01L 23/481; H01L 27/0255; H01L 27/0292; H01L 21/6898; H01L 23/60
USPC ................... 257/173, 355, 528, 653, 700, 774
See application file for complete search history.

(56) References Cited

U.S. PATENT DOCUMENTS

| 8,164,113 | B2 | 4/2012 | Lin et al. | |
|---|---|---|---|---|
| 8,338,961 | B2 | 12/2012 | Su et al. | |
| 8,502,338 | B2 * | 8/2013 | Yen et al. | 257/508 |
| 8,810,010 | B2 * | 8/2014 | Kim | 257/653 |
| 2008/0067622 | A1 | 3/2008 | Bui et al. | |
| 2008/0315257 | A1 | 12/2008 | Shiraishi | |

(Continued)

OTHER PUBLICATIONS

International Search Report and Written Opinion for International Application No. PCT/US2014/035076, ISA/EPO, Date of Mailing Aug. 20, 2014, 11 pages.

*Primary Examiner* — Dung Le
(74) *Attorney, Agent, or Firm* — Toler Law Group, PC

(57) ABSTRACT

A method includes thinning a back-side of a substrate to expose a portion of a first via that is formed in the substrate. The method also includes forming a first diode at the back-side of the substrate. The first diode is coupled to the first via.

13 Claims, 8 Drawing Sheets

(56) References Cited

U.S. PATENT DOCUMENTS

| | | |
|---|---|---|
| 2009/0278251 A1 | 11/2009 | Tsai et al. |
| 2010/0032767 A1 | 2/2010 | Chapman et al. |
| 2010/0059869 A1 | 3/2010 | Kaskoun et al. |
| 2011/0304010 A1 | 12/2011 | Jiang et al. |
| 2012/0238069 A1 | 9/2012 | Voldman |
| 2012/0248582 A1 | 10/2012 | Gu et al. |
| 2013/0221363 A1 | 8/2013 | Prechtl et al. |

\* cited by examiner

```
                                            ┌─1102
Thin a back-side of a substrate to expose a portion of a first via that
              is formed in the substrate │
                            ▼
                                            ┌─1104
Form a first diode at the back-side of the substrate, where the first
              diode is coupled to the first via
```

ELECTROSTATIC DISCHARGE DIODE

I. FIELD

The present disclosure is generally related to an electrostatic discharge diode.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, may communicate voice and data packets over wireless networks. Further, many such wireless telephones include other types of devices that are incorporated therein. For example, a wireless telephone may also include a digital still camera, a digital video camera, a digital recorder, and an audio file player. Also, such wireless telephones may process executable instructions, including software applications, such as a web browser application, that may be used to access the Internet. As such, these wireless telephones may include significant computing capabilities.

A semiconductor device for use in wireless communication devices may be formed using through-silicon-via (TSV) technology to provide electrical connections between silicon chips. For example, silicon chips may include integrated circuits that are interconnected using TSVs that are fabricated within the silicon wafers for vertical connections. The vertical connections of the integrated circuits may be used to form a three-dimensional integrated circuit. Because the three-dimensional integrated circuit is formed using multiple silicon wafers, assembly processes used to interconnect these silicon chips (or circuits within each silicon chip) to each other, or to a package substrate, may cause high-voltage static electricity to pass through the TSVs to the circuits on each of the chips, resulting in damage to the circuits.

Electrostatic discharge diodes coupled to the front-side (i.e., active layers) of the silicon chips may be used to sink charges resulting from the static electricity or noise. For example, an electrostatic discharge diode coupled to the front-side of the silicon chip may sink charges into a substrate of the silicon wafer. However, placing electrostatic discharge diodes at the front-side of the silicon wafers may consume a large die area that could otherwise be used for active circuits (i.e., active integrated circuits).

III. SUMMARY

This disclosure presents particular embodiments of a silicon chip using through-silicon-via (TSV) technology to interconnect with other silicon chips. Electrostatic discharge diodes may be formed on the back-side of the silicon chip to sink electrostatic charges into a silicon substrate of the silicon chip. For example, a metallic redistribution layer may form a Schottky barrier diode when coming into contact with the silicon substrate of the chip. The Schottky barrier diode may activate in response to a negative voltage (e.g., electrostatic charges having a negative polarity) and may sink the electrostatic charges into the silicon substrate. Additionally, a diode having an opposite polarity may be formed by placing the metallic redistribution layer in contact with n-type semiconductor material, such as Indium Oxide or Indium Tin Oxide, on the back-side of the silicon wafer. The diode may activate in response to a positive voltage (e.g., electrostatic charges having a positive polarity) and sink the electrostatic charges into the silicon substrate.

In a particular embodiment, a method includes thinning a back-side of a substrate to expose a portion of a first via formed in the substrate. The method also includes forming a first diode at the back-side of the substrate. The first diode is coupled to the first via.

In another particular embodiment, a device includes a substrate and a first via that extends from a back-side of the substrate. The device also includes a first diode at the back-side of the substrate. The first diode is coupled to the first via and sinks electrostatic charges into the substrate.

In another particular embodiment, an apparatus includes means for sinking electrostatic charges having a negative polarity into a substrate of a through-silicon-via (TSV) wafer. The means for sinking the electrostatic charges having the negative polarity are located at a back-side of the substrate. The apparatus also includes means for sinking electrostatic charges having a positive polarity into the substrate. The means for sinking the electrostatic charges having the positive polarity are located at a back-side of the substrate.

One particular advantage provided by at least one of the disclosed embodiments is that by forming a diode at the back-side of the substrate to sink electrostatic charges into the substrate, additional die area at the front of the substrate may potentially be used for active circuits. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of wafers having electrostatic discharge diodes at a back-side of a substrate and methods of fabrication are presented in this disclosure. It should be appreciated, however, that the concepts and insights applied to the particular embodiments with respect to designs of the electrostatic discharge diodes and with respect to how to make the electrostatic discharge diodes may be embodied in a variety of contexts. The particular embodiments presented are merely illustrative of specific ways to design and make the electrostatic discharge diodes and do not limit the scope of this disclosure.

The present disclosure describes the particular embodiments in specific contexts. However, features, methods, structures or characteristics described according to the particular embodiments may also be combined in suitable manners to form one or more other embodiments. In addition, figures are used to illustrate the relative relationships between the features, methods, structures, or characteristics, and thus may not be drawn in scale. Directional terminology, such as "back-side", "front-side", etc. is used with reference to the orientation of the figures being described. The components of the disclosure may be positioned in a number of different orientations. As such, the directional terminology is used for purposes of illustration and is not meant to be limiting.

Figure 1:
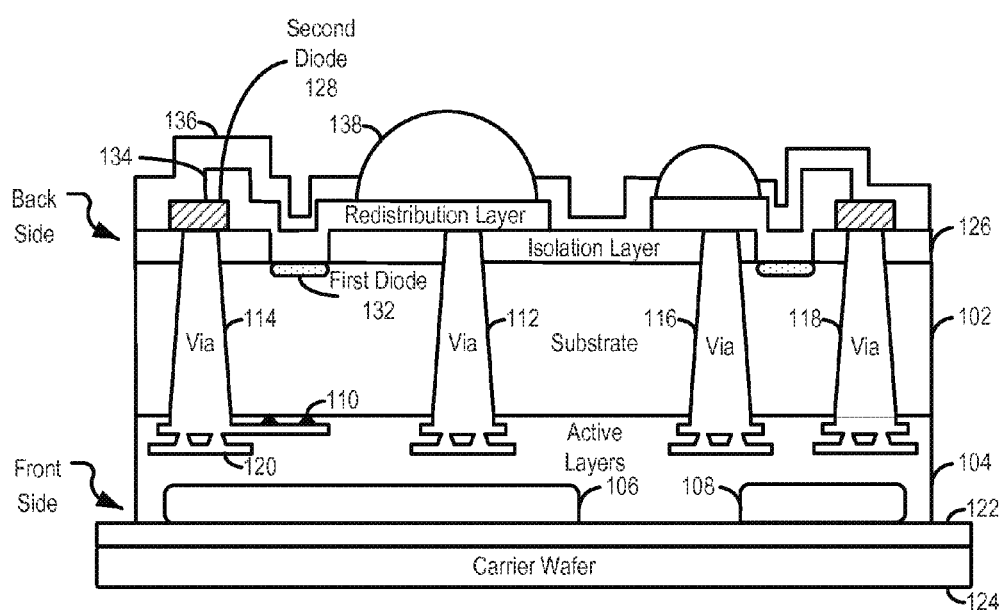
FIG. 1 is a diagram of a particular illustrative embodiment of a through-silicon-via (TSV) wafer including an electrostatic discharge diode at a back-side of a substrate.

Referring to FIG. 1, a particular illustrative embodiment of a through-silicon-via (TSV) wafer including an electrostatic discharge diode at a back-side of a substrate is shown. FIG. 1 shows a cross-sectional view of a portion of the TSV wafer that includes the electrostatic diode.

The TSV wafer includes a front-side and a back-side. The TSV wafer includes a substrate 102. The substrate 102 may be a p-type implantable substrate. In a particular embodiment, the substrate 102 is a silicon (Si) substrate. The TSV wafer may include a first via 112 that extends through the substrate 102, a second via 114 that extends through the substrate 102, a third via 116 that extends through the substrate 102, and a fourth via 118 that extends through the substrate 102. As described with respect to FIGS. 2-3, the vias 112-118 may extend partially through the substrate 102 prior to an etching process to thin the back-side of the substrate 102. In a particular embodiment, the vias 112-118 are through-silicon-vias (TSVs), and the vias 112-118 may be filled with metal. In a particular embodiment, the metal includes at least one of copper (Cu), tungsten (W), silver (Ag), or gold (Au).

The front-side of the TSV wafer may include active layers 104. The active layers 104 may include a first aluminum metallization portion 106 and a second aluminum metallization portion 108. In a particular embodiment, inputs and outputs (I/Os) of the TSV wafer may be formed in the first and second aluminum metallization portions 106, 108. A contact 110 to the substrate 102 may also be included in the active layers 104. A portion 120 of the second via 114 may extend into the active layers 104. The contact 110 may be coupled to the portion 120 of the second via 114, and the contact 110 extends into the active layers 104. As described below, the contact 110 may sink electrostatic charges having positive polarity into the substrate 102.

The back-side of the TSV wafer may include an isolation layer 126 formed on the substrate 102. The isolation layer 126 may isolate selective portions of the substrate 102 from metal contacts. In a particular embodiment, the isolation layer 126 includes at least one of silicon dioxide ($SiO_2$), silicon nitride ($Si_3N_4$), silicon oxynitride (SiOxNy), tantalum pentoxide ($Ta_2O_5$), aluminum oxide ($Al_2O_3$), and aluminum nitride (AlN), as well as polymeric insulating materials, such as polyimide.

The back-side of the TSV wafer may also include a redistribution layer 134 formed on the isolation layer 126. In a particular embodiment, the redistribution layer 134 includes at least one of aluminum (Al), copper (Cu), silver (Ag), and tungsten (W). In a particular embodiment, the redistribution layer 134 may have an under-bump-metallization (UBM) layer underneath the main metal. The UBM layer may include at least one of Titanium (Ti), Titanium-Tungsten (TiW), Tantalum nitride (TaN), or other such material and multi-layers thereof. As described with respect to FIG. 6, the isolation layer 126 may include an opening that permits a portion of the redistribution layer 134 to come in contact (e.g., direct contact) with the substrate 102. When the redistribution layer 134 comes into contact with the substrate 102, a first diode 132 may be formed to sink electrostatic charges into the substrate 102. For example, placing metal (e.g., copper (Cu)) from the redistribution layer 134 in direct contact with silicon (e.g., the substrate 102) may form a Schottky barrier diode (e.g., the first diode 132). The first diode 132 may activate in response to a low (e.g., ground or negative) voltage. For example, the first diode 132 may activate in response to electrostatic charges having a negative polarity and sink the electrostatic charges into the substrate 102.

The back-side of the TSV wafer may also include a second diode 128 to sink electrostatic charges having a positive polarity into the substrate 102. For example, an n-type semiconductor material may be placed on the second via 114. When the redistribution layer 134 comes into contact with the n-type semiconductor material, the second diode 128 may be formed to sink electrostatic charges into the substrate 102 via the second via 114 and the contact 110. For example, electrostatic charges having a positive polarity may activate the second diode 128 and pass through the second via 114 to the contact 110. The contact 110 may sink the electrostatic charges to the substrate 102. In a particular embodiment, the n-type semiconductor material is at least one of indium oxide ($In_2O_3$) or indium tin oxide (ITO).

The back-side of the TSV wafer may include micro-bumps 138 that are patterned on the redistribution layer 134. The micro-bumps 138 may be used for interconnection between the TSV wafer and another TSV or non-TSV wafer (not shown). The micro-bumps 138 may enable conductivity between portions of the TSV wafer and another wafer. For example, electrical conductivity may flow from the aluminum metallization portions 106, 108 of the TSV wafer to another TSV wafer via a conductivity path comprising the vias 112-118, the redistribution layer 134, and the micro-bumps 138. In a particular embodiment, the micro-bumps 138 are used to connect the TSV wafer with other TSV wafers when the TSV wafer is flipped. The back-side of the TSV wafer may also include a dielectric layer 136 that is patterned on the redistribution layer 134 to electrically isolate the redistribution layer 134 from external elements.

Figure 3:
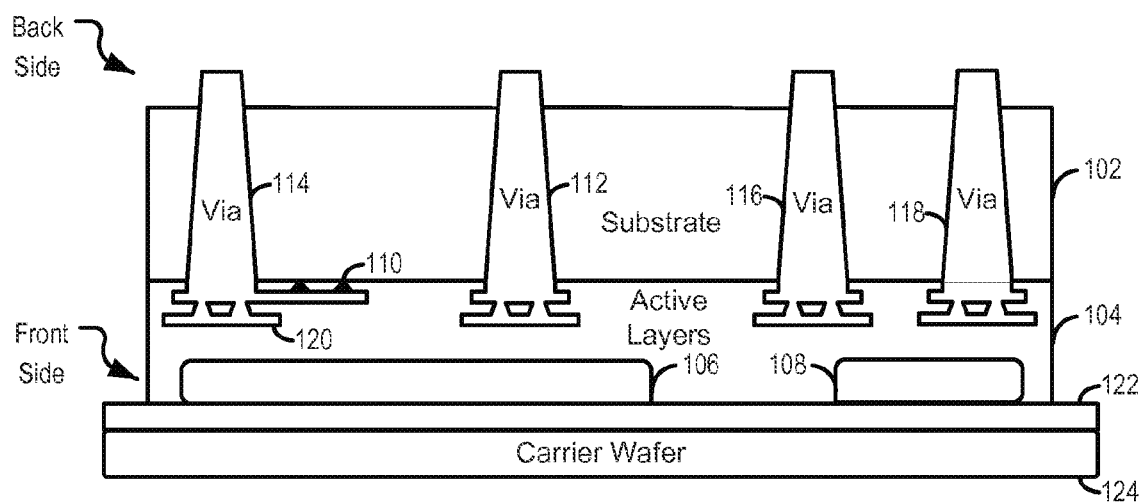
FIG. 3 is a diagram illustrating another particular stage of forming the TSV wafer of FIG. 1.

As described with respect to FIG. 3, the TSV wafer may be flipped and placed on a carrier wafer 124. An adhesive layer 122 may be placed on the carrier wafer 124 to hold the TSV wafer in place.

During operation, electrostatic charges may be created during interconnection of TSV wafers. For example, electrostatic charges may be created at the micro-bumps 138 and at the vias 112-118 due to temperature and voltage variations when connecting the TSV wafer with other TSV wafers. The first and second diodes 132, 128 may sink the electrostatic charges into the substrate 102. For example, in response to electrostatic charges having a negative polarity (e.g., a negative charge), the first diode 132 (i.e., the Schottky barrier diode) may activate and sink the electrostatic charges into the substrate 102. Alternatively, or in addition, in response to electrostatic charges having a positive polarity (e.g., a positive charge), the second diode 128 may activate and sink the electrostatic charges into the substrate 102. For example, upon activation, the second diode 128 may pass the electrostatic charges through the second via 114 to the contact 110, and the contact 110 may sink the electrostatic charge into the substrate 102.

It will be appreciated that forming the first and second diodes 132, 128 at the back-side of the TSV wafer to sink electrostatic charges into the substrate 102 may improve design flexibility. For example, die area at the front-side of the TSV wafer may be used for active circuits rather than for electrostatic discharge diodes. Forming the first diode 132 (i.e., Schottky barrier diode) using the redistribution layer 134 and the substrate 102 may reduce process temperature constraints that may otherwise exist by placing an implantable P-N junction diode at the back-side of the TSV wafer. For example, implanting the P-N junction diode at the back-side of the TSV wafer may involve using high temperature for junction activation, which may affect integrated circuits and I/O devices at the front-side of the TSV wafer as well as the bond between the TSV wafer and the carrier wafer 124 it is situated upon. The Schottky barrier diodes may be implemented using low temperatures. Because the back-side of the TSV wafer may be less dense with circuitry than the front-side of the TSV wafer, using a Schottky barrier diode as an electrostatic discharge diode may permit the use of large electrostatic discharge diodes with reduced constraints on temperature.

Figure 2:
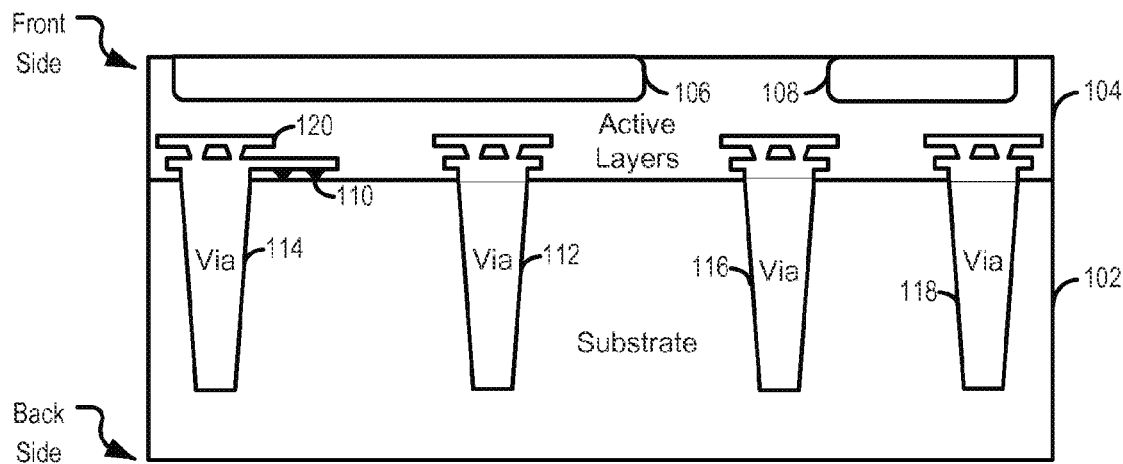
FIG. 2 is a diagram illustrating a particular stage of forming the TSV wafer of FIG. 1.

Referring to FIG. 2, a diagram illustrating a particular stage of forming the electrostatic discharge diode at the back-side of the substrate 102 of the TSV wafer is shown. In a particular embodiment, the particular stage of the TSV wafer shown in FIG. 2 may correspond to a stage after fabrication of the front-side of the TSV wafer is completed. For example, the TSV wafer includes the substrate 102 and the active layers 104. The vias 112-118 are implanted into the substrate 102. Portions (e.g., the portion 120 of the second via 114) of the vias 112-118 may be within the active layers 104. The aluminum metallization portions 106, 108 are implemented in the active layers 104. In a particular embodiment, formation of the active layers 104 and the components within the active layers are formed via back-end-of-line (BEOL) processing. The contact 110 may be coupled to the portion 120 of the second via 114 that extends into the active layers 104 and may be coupled to the substrate 102. In some embodiments, there may be solder bumps (not shown) or Cu pillar bumps (not shown) on top of the aluminum metallization portions 106, 108.

Referring to FIG. 3, a diagram illustrating another particular stage of forming the electrostatic discharge diode at the back-side of the substrate 102 of the TSV wafer is shown. During the particular stage shown in FIG. 3, the TSV wafer is flipped over and placed on the carrier wafer 124. For example, the adhesive layer 122 is placed on top of the carrier wafer 124 to hold the TSV wafer in place (e.g., hold in place the active layers 104 and the aluminum metallization portions 106, 108 that come in contact with the adhesive layer 122).

During the particular stage shown in FIG. 3, the back-side of the substrate 102 (e.g., the backside of the TSV wafer) may be thinned to expose a portion of the vias 112-118 that are formed within the substrate 102. For example, the back-side of the substrate 102 may be thinned using an etching process.

Figure 4:
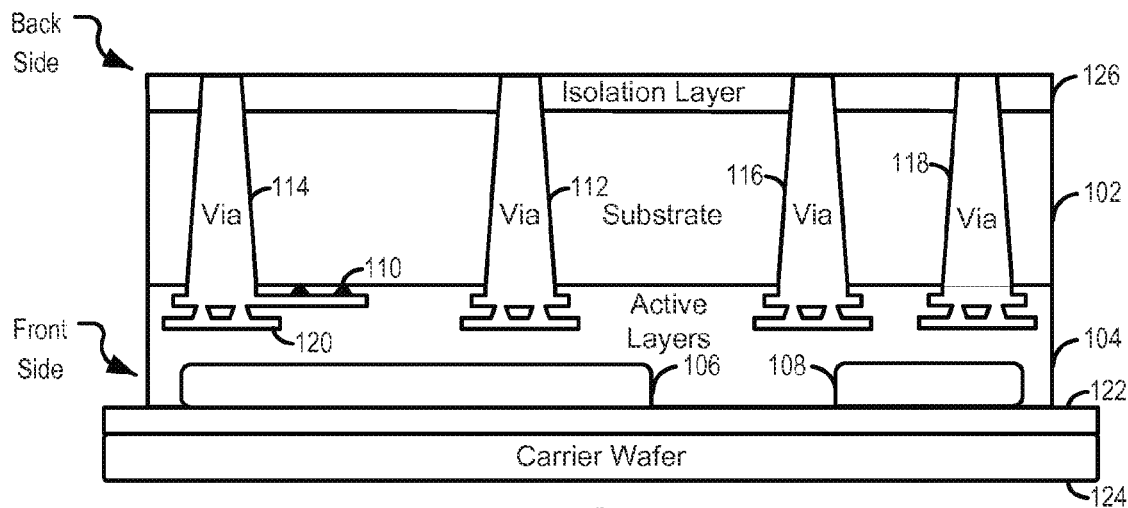
FIG. 4 is a diagram illustrating another particular stage of forming the TSV wafer of FIG. 1.

Referring to FIG. 4, a diagram illustrating another particular stage of forming the electrostatic discharge diode at the back-side of the substrate 102 of the TSV wafer is shown. During the particular stage shown in FIG. 4, the isolation layer 126 is deposited on the substrate 102 at the back-side of the TSV wafer. After the isolation layer 126 is deposited on the substrate 102, the isolation layer 126 may be planarized. In a particular embodiment, the isolation layer 126 is planarized using a chemical-mechanical-polishing (CMP) technique. The isolation layer 126 may isolate the redistribution layer 134 (shown in FIG. 1) from the substrate 102.

Figure 5:
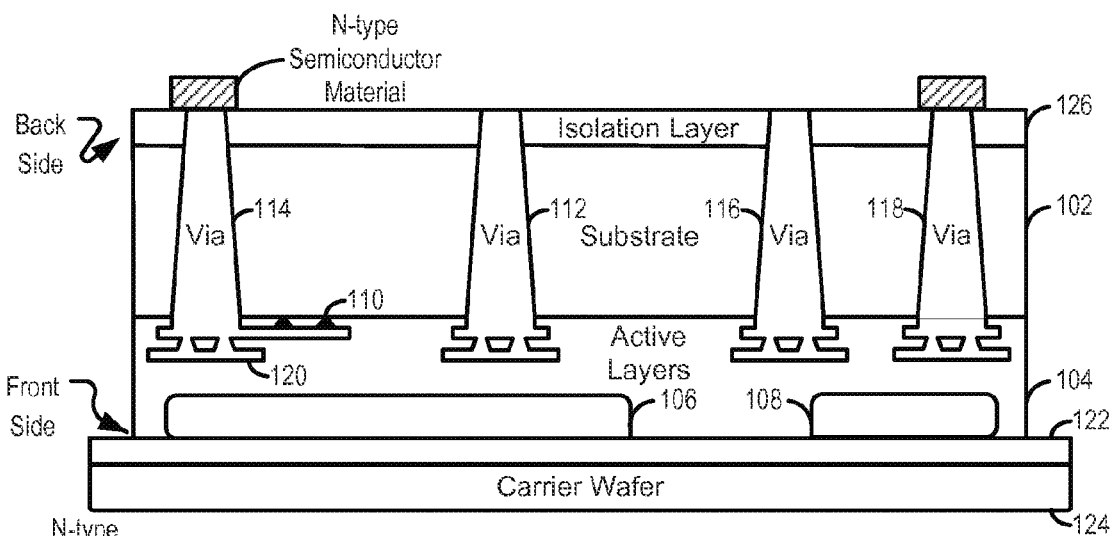
FIG. 5 is a diagram illustrating another particular stage of forming the TSV wafer of FIG. 1.

Referring to FIG. 5, a diagram illustrating another particular stage of forming the electrostatic discharge diode at the back-side of the substrate 102 of the TSV wafer is shown. During the particular stage shown in FIG. 5, an n-type semiconductor material may be deposited on at the back-side of the TSV wafer. The n-type semiconductor material may be patterned to cover particular regions of the back-side of the TSV wafer. For example, the n-type semiconductor material may be patterned to cover a region over the second via 114 and a region over the fourth via 118. As described with respect to FIG. 1, the n-type semiconductor may form the second diode 128 when contacted by the metalized redistribution layer 134.

Figure 6:
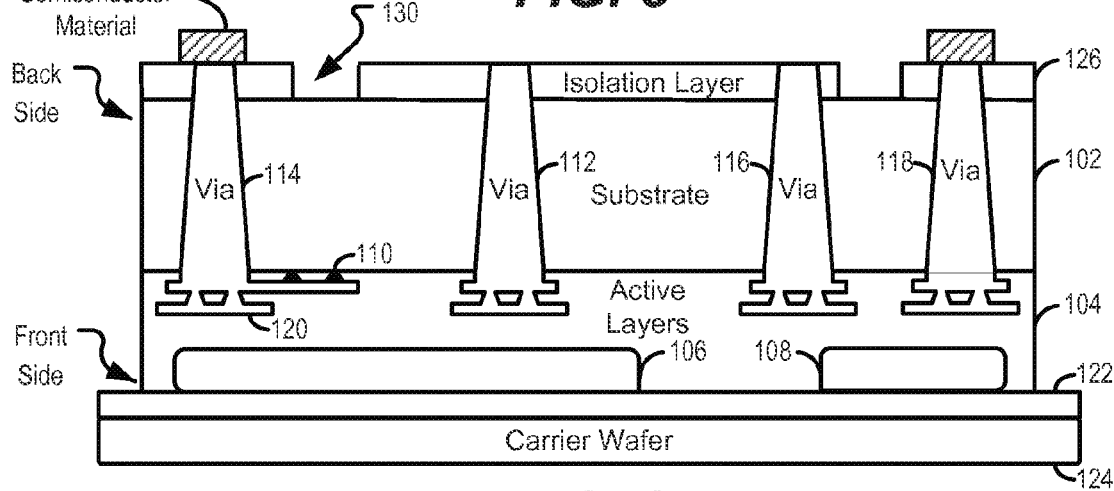
FIG. 6 is a diagram illustrating another particular stage of forming the TSV wafer of FIG. 1.

Referring to FIG. 6, a diagram illustrating another particular stage of forming the electrostatic discharge diode at the back-side of the substrate 102 of the TSV wafer is shown. During the particular stage shown in FIG. 6, an opening 130 is selectively patterned in the isolation layer 126. The opening 130 may expose a portion of the substrate 102.

Figure 7:
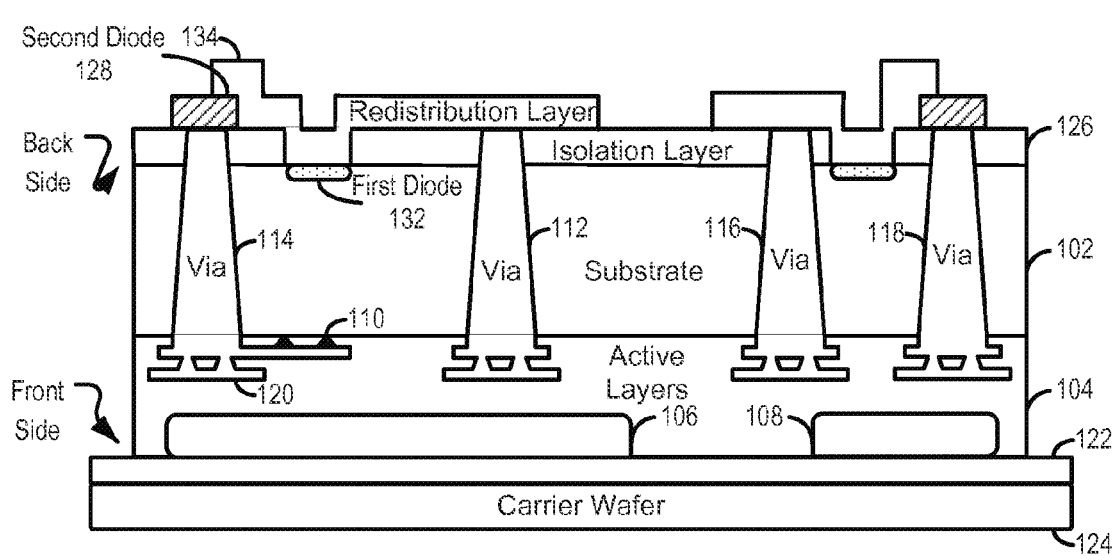
FIG. 7 is a diagram illustrating another particular stage of forming the TSV wafer of FIG. 1.

Referring to FIG. 7, a diagram illustrating another particular stage of forming the electrostatic discharge diode at the back-side of the substrate 102 of the TSV wafer is shown. During the particular stage shown in FIG. 7, the redistribution layer 134 is deposited and patterned in the opening 130 and on the n-type semiconductor material to form the first and second diodes 132, 128, respectively.

In a particular embodiment, the first diode 132 and the second diode 128 have substantially opposite polarities. For example, the first diode 132 may be a p-type diode and the second diode 128 may be an n-type diode. When the redistribution layer 134 comes into contact with the substrate 102 via the opening 130, the first diode 132 may be formed to sink electrostatic charges into the substrate 102. Placing metal (e.g., copper (Cu) or the under-bump-metallization (UBM)) from the redistribution layer 134 in direct contact with silicon (e.g., the substrate 102) may form a Schottky barrier. The first diode 132 may activate in response to a low (e.g., ground or negative) voltage. For example, electrostatic charges having a negative polarity may activate the first diode 132, and the first diode 132 may sink the electrostatic charges into the substrate 102. When the redistribution layer 134 comes into contact with the n-type semiconductor material, the second diode 128 may be formed to sink electrostatic charges into the substrate 102 via the second via 114 and the contact 110. For example, electrostatic charges having a positive polarity may activate the second diode 128 and pass through the second via 114 to the contact 110.

It will be appreciated that the first via 112 may be protected from electrostatic charges having negative and positive polarities. For example, the first via 112 may be electrically coupled to the redistribution layer 134. Electrostatic charges having a negative polarity that are in contact with the redistribution layer 134 may activate the first diode 132. Upon activation, the electrostatic charge may be discharged in the substrate 102. Electrostatic charges having a positive polarity that are in contact with the redistribution layer 134 may activate the second diode 128. Upon activation, the electrostatic charges may be discharged in the substrate 102 via the second via 114 and the contact 110. In a particular embodiment, an I/O (not shown), such as the I/Os in the aluminum metallization portions 106, 108, may be electrically coupled to the first via 112. Electrostatic discharge resulting from the I/O may be deposited into the substrate via the first and second diodes 132, 128 at the back-side of the TSV using the conductivity of the first via 112 and the redistribution layer 134.

Figure 8:
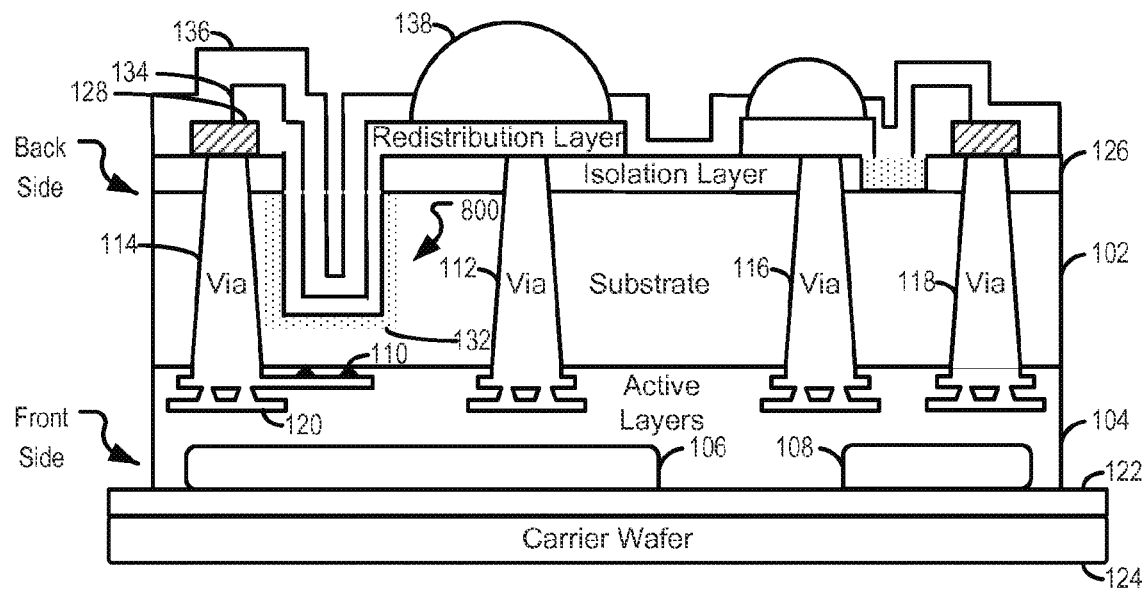
FIG. 8 is a diagram of another particular illustrative embodiment of TSV wafer of FIG. 1.

Referring to FIG. 8, another particular illustrative embodiment of a TSV wafer including an electrostatic discharge diode at a back-side of a substrate is shown. The TSV wafer illustrated in FIG. 8 may include a trench 800 at the back-side of the TSV wafer.

For example, prior to depositing the redistribution layer 134 in FIG. 7, the trench 800 may be created within the substrate 102. Creating the trench 800 may reduce series resistance between the substrate 102 and the first diode 132. For example, sidewalls of the trench 800 may increase a contact area between the redistribution layer 134 and the substrate 102, which may generate a larger first diode 132. The trench 800 may also bring the electrostatic charges closer to the substrate 102 which may decrease a parasitic resistance of the first diode 132.

Figure 9:
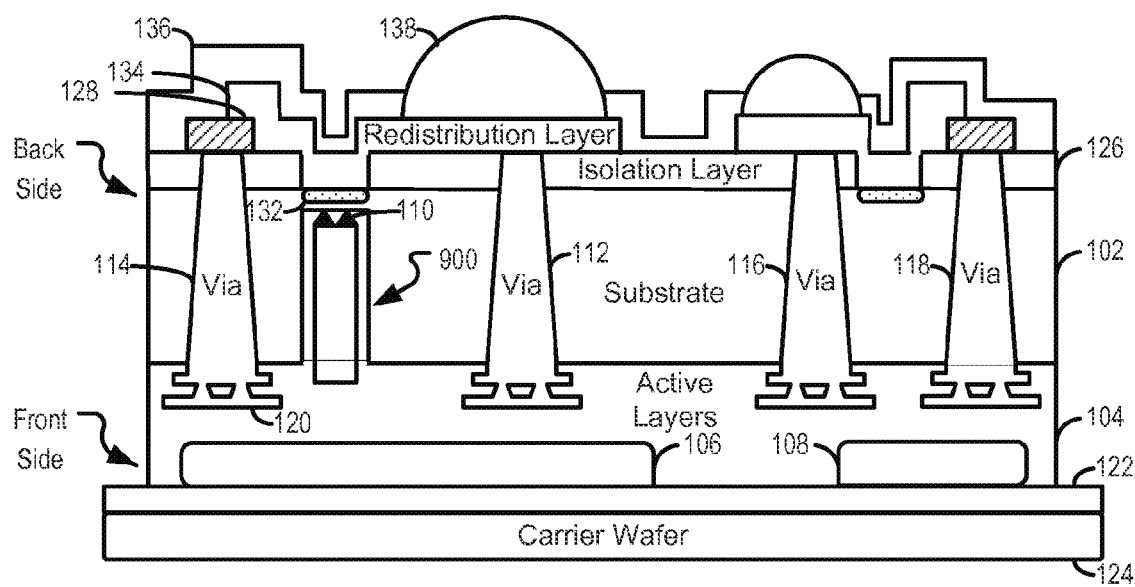
FIG. 9 is a diagram of another particular illustrative embodiment of TSV wafer of FIG. 1.

Referring to FIG. 9, another particular illustrative embodiment of a TSV wafer including an electrostatic discharge diode at a back-side of a substrate is shown. The TSV wafer illustrated in FIG. 9 may include a trench 900 at the front-side of the TSV wafer. Creating the trench 900 may also reduce series resistance between the substrate 102 and the second diode 128.

Figures 10, 11:
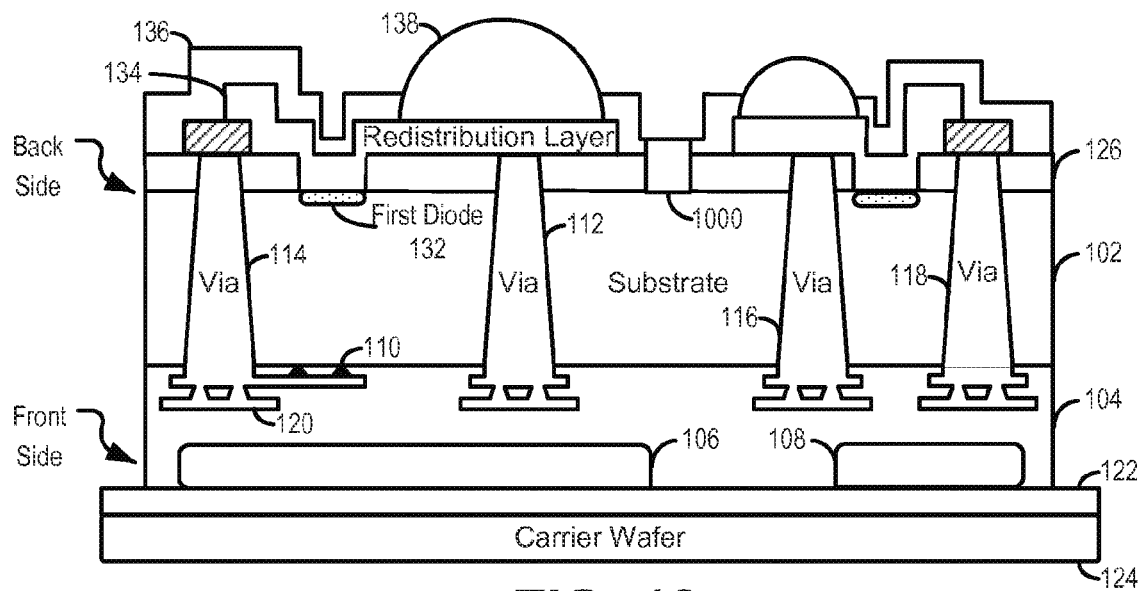
FIG. 10 is a diagram of another particular illustrative embodiment of TSV wafer of FIG. 1.
FIG. 11 is a flowchart of a particular illustrative embodiment of a method of forming an electrostatic discharge diode at a back-side of a substrate of a TSV wafer.

Referring to FIG. 10, another particular illustrative embodiment of a TSV wafer including an electrostatic discharge diode at a back-side of a substrate is shown. The TSV wafer illustrated in FIG. 10 may include a substrate contact 1000 at the back-side of the TSV wafer to reduce a resistance between electrostatic discharge diodes at the back-side of the TSV wafer and the substrate 102.

Referring to FIG. 11, a particular illustrative embodiment of a method of forming an electrostatic discharge diode at a back-side of a substrate of a TSV wafer is shown. The method of FIG. 11 may be performed to fabricate or in reference to embodiments of the TSV wafers depicted in FIGS. 1-10.

The method may include thinning a back-side of a substrate to expose a portion of a first via that is formed in the substrate, at 1102. For example, in FIG. 3, the back-side of the substrate 102 (e.g., the backside of the TSV wafer) may be thinned to expose a portion of the first via 112 that is formed within the substrate 102. The back-side of the substrate 102 may be thinned using an etching process.

A first diode may be formed at the back-side of the substrate, at 1104. For example, in FIG. 7, the redistribution layer 134 may be deposited and patterned in the opening 130 and on the n-type semiconductor material to form the first and second diodes 132, 128, respectively. The first diode 132 may be coupled to the first via 112 via the redistribution layer 134, and the second diode 128 may be coupled to the second via 114 via the redistribution layer 134.

It will be appreciated that the method of FIG. 11 may improve design flexibility by forming the first and second diodes 132, 128 at the back-side of the TSV wafer to sink electrostatic charges into the substrate 102. For example, die area at the front-side of the TSV wafer may potentially be used for active circuits rather than for electrostatic discharge diodes. Forming the first diode 132 (i.e., Schottky barrier diode) using the redistribution layer 134 and the substrate 102 may reduce temperature constraints that may otherwise exist by placing an implantable P-N junction diode at the back-side of the TSV wafer. For example, implanting the P-N junction diode at the back-side of the TSV wafer may involve using high temperature, which may affect integrated circuits and I/Os at the front-side of the TSV wafer. The Schottky barrier diodes may be implemented using low temperature. Because the back-side of the TSV wafer may be less dense with circuitry than the front-side of the TSV wafer, using a Schottky barrier diode as an electrostatic discharge diode may permit the use of large electrostatic discharge diodes with reduced constraints on temperature.

Figure 12:
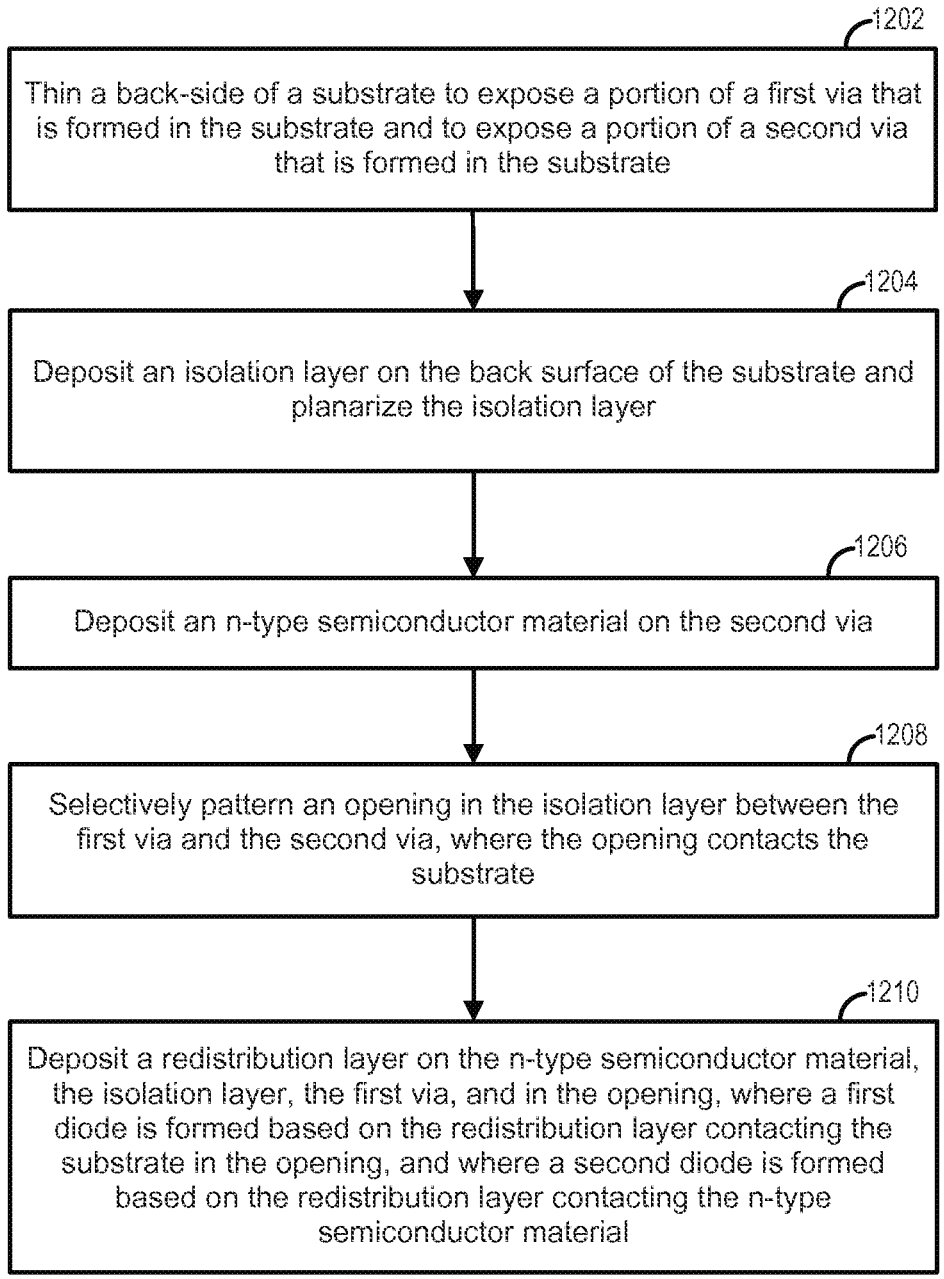
FIG. 12 is a flowchart of another particular illustrative embodiment of a method of forming an electrostatic discharge diode at a back-side of a substrate of a TSV wafer.

Referring to FIG. 12, another particular illustrative embodiment of a method for forming an electrostatic discharge diode at a back-side of a substrate of a TSV wafer is shown. The method of FIG. 12 may be performed to fabricate or in reference to embodiments of the TSV wafers depicted in FIGS. 1-10.

The method may include thinning a back-side of a substrate to expose a portion of a first via that is formed in the substrate and to expose a portion of a second via that is formed in the substrate, at 1202. For example, in FIG. 3, the back-side of the substrate 102 (e.g., the backside of the TSV wafer) may be thinned to expose a portion of the first via 112 that is formed within the substrate 102 and a portion of the second via 114 that is formed within the substrate 102. The back-side of the substrate 102 may be thinned using an etching process.

An isolation layer may be deposited and planarized on the back-side of the substrate, at 1204. For example, in FIG. 4, the isolation layer 126 is deposited on the substrate 102 at the back-side of the TSV wafer. After the isolation layer 126 is deposited on the substrate 102, the isolation layer 126 may be planarized. In a particular embodiment, the isolation layer 126 is planarized using a chemical-mechanical-polishing (CMP) technique. The isolation layer 126 may isolate the redistribution layer 134 (as shown in FIG. 1) from the substrate 102.

An n-type semiconductor material may be deposited on the second via, at 1206. For example, in FIG. 5, the n-type semiconductor material may be deposited on the back-side of the TSV wafer. The n-type semiconductor material may be patterned to cover particular regions of the back-side of the TSV wafer. For example, the n-type semiconductor material may be patterned to cover a region over the second via 114. An opening may be selectively patterned in the isolation layer between the first via and the second via, at 1208. For example, in FIG. 6, the opening 130 is selectively patterned in the isolation layer 126 between the first and second vias 112, 114. The opening 130 may contact the substrate 102.

A redistribution layer may be deposited on the n-type semiconductor material, the isolation layer, the first via, and in the opening, at 1210. For example, in FIG. 7, the redistribution layer 134 may be deposited and patterned in the opening 130 and on the n-type semiconductor material to form the first and second diodes 132, 128, respectively. When the redistribution layer 134 comes into contact with the substrate 102 via the opening 130, the first diode 132 may be formed to sink electrostatic charges into the substrate 102. Placing metal (e.g., copper (Cu) or under-bump-metallization (UBM)) from the redistribution layer 134 in direct contact with silicon (e.g. the substrate 102) may form a Schottky barrier. The first diode 132 may activate in response to a low (e.g., ground or negative) voltage. For example, electrostatic charges having a negative polarity may activate the first diode 132, and the first diode 132 may sink the electrostatic charges into the substrate 102. When the redistribution layer 134 comes into contact with the n-type semiconductor material, the second diode 128 may be formed to sink electrostatic charges into the substrate 102 via the second via 114 and the contact 110. For example, electrostatic charges having a positive polarity may activate the second diode 128 and pass through the second via 114 to the contact 110.

Figure 13:
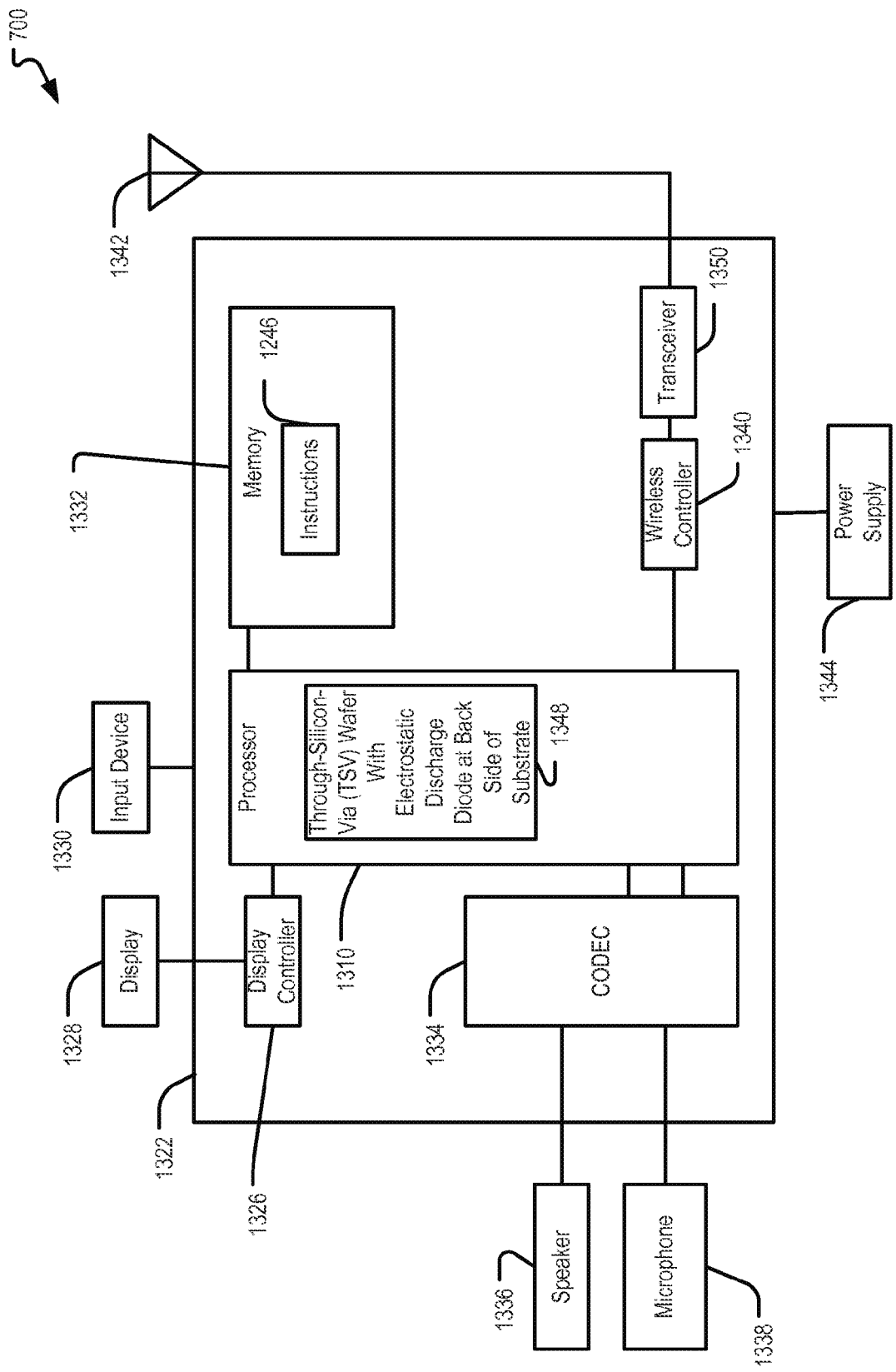
FIG. 13 is a block diagram of a wireless communication device including a TSV wafer that includes an electrostatic discharge diode at a back-side of a substrate.

Referring to FIG. 13, a block diagram of a particular illustrative embodiment of a wireless communication device is depicted and generally designated 1300. The device 1300 includes a processor 1310, such as a digital signal processor (DSP), coupled to a memory 1332 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). The memory 1332 may store instructions 1362 that are executable by the processor 1310. The memory 1332 may store data 1366 that is accessible to the processor 1310.

The device 1300 includes a TSV wafer 1348 that includes an electrostatic discharge diode at a back-side of a substrate. In an illustrative embodiment, the TSV wafer 1348 may correspond to the TSV wafers depicted in FIGS. 1-10. FIG. 13 also shows a display controller 1326 that is coupled to the processor 1310 and to a display 1328. A coder/decoder (CODEC) 1334 may also be coupled to the processor 1310. A speaker 1336 and a microphone 1338 may be coupled to the CODEC 1334. FIG. 13 also indicates that a wireless controller 1340 may be coupled to the processor 1310 and may be further coupled to an antenna 1342 via the RF interface 1352.

In a particular embodiment, the processor 1310, the display controller 1326, the memory 1332, the CODEC 1334, and the wireless controller 1340 are included in a system-in-package or system-on-chip device 1322. In a particular embodiment, an input device 1330 and a power supply 1344 are coupled to the system-on-chip device 1322. Moreover, in a particular embodiment, as illustrated in FIG. 13, the display 1328, the input device 1330, the speaker 1336, the microphone 1338, the antenna 1342, and the power supply 1344 are external to the system-on-chip device 1322. However, each of the display 1328, the input device 1330, the speaker 1336, the microphone 1338, the wireless antenna 1342, and the power supply 1344 may be coupled to a component of the system-on-chip device 1322, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then integrated into electronic devices, as described further with reference to FIG. 14.

Figure 14:
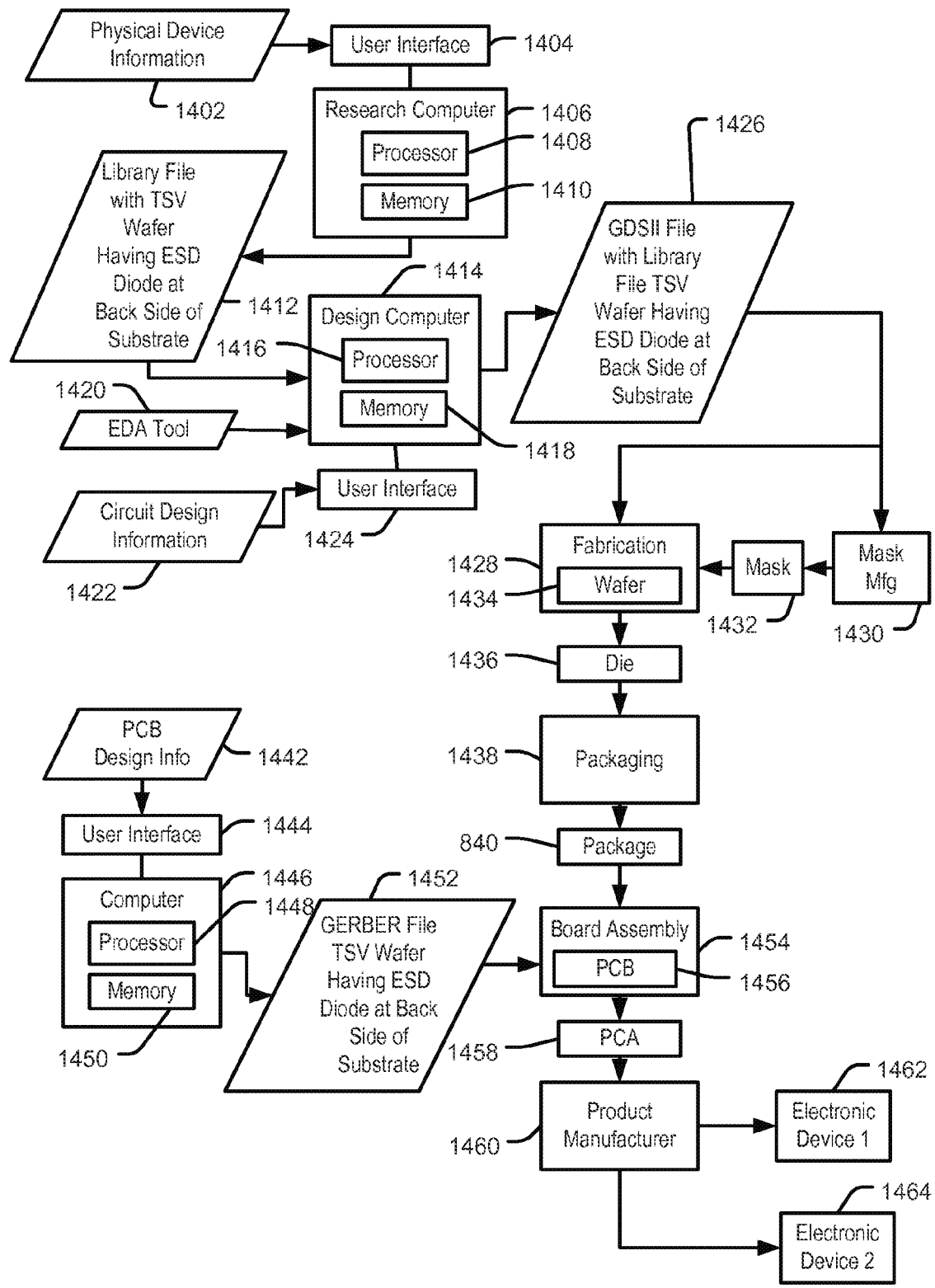
FIG. 14 is a data flow diagram of a particular illustrative embodiment of a process to manufacture electronic devices that include a TSV wafer that includes an electrostatic discharge diode at a back-side of a substrate.

Referring to FIG. 14, a particular illustrative embodiment of an electronic device manufacturing process is depicted and generally designated 1400. In FIG. 14, physical device information 1402 is received at the manufacturing process 1400, such as at a research computer 1406. The physical device information 1402 may include design information representing at least one physical property of a semiconductor device, such as a TSV wafer that includes an electrostatic discharge diode at a back-side of a substrate (e.g., the TSV wafer illustrated in FIGS. 1-10 and/or a TSV wafer formed according to the methods 1100-1200 of FIGS. 11-12). For example, the physical device information 1402 may include physical parameters, material characteristics, and structure information that is entered via a user interface 1404 coupled to the research computer 1406. The research computer 1406 includes a processor 1408, such as one or more processing cores, coupled to a computer readable medium such as a memory 1410. The memory 1410 may store computer readable instructions that are executable to cause the processor 1408 to transform the physical device information 1402 to comply with a file format and to generate a library file 1412.

In a particular embodiment, the library file 1412 includes at least one data file including the transformed design information. For example, the library file 1412 may include a library of devices including a TSV wafer that includes an electrostatic discharge diode at a back-side of a substrate (e.g., the TSV wafer illustrated in FIGS. 1-10 and/or a TSV wafer formed according to the methods 1100-1200 of FIGS. 11-12) provided for use with an electronic design automation (EDA) tool 1420.

The library file 1412 may be used in conjunction with the EDA tool 1420 at a design computer 1414 including a processor 1416, such as one or more processing cores, coupled to a memory 1418. The EDA tool 1420 may be stored as processor executable instructions at the memory 1418 to enable a user of the design computer 1414 to design a TSV wafer that includes an electrostatic discharge diode at a back-side of a substrate (e.g., the TSV wafer illustrated in FIGS. 1-10 and/or a TSV wafer formed according to the methods 1100-1200 of FIGS. 11-12) using the library file 1412. For example, a user of the design computer 1414 may enter circuit design information 1422 via a user interface 1424 coupled to the design computer 1414. The circuit design information 1422 may include design information representing at least one physical property of a TSV wafer that includes an electrostatic discharge diode at a back-side of a substrate (e.g. the TSV wafer illustrated in FIGS. 1-10 and/or a TSV wafer formed according to the methods 1100-1200 of FIGS. 11-12). To illustrate, the circuit design property may include identification of particular circuits and relationships to other elements in a circuit design, positioning information, feature size information, interconnection information, or other information representing a physical property of a semiconductor device.

The design computer 1414 may be configured to transform the design information, including the circuit design information 1422, to comply with a file format. To illustrate, the file formation may include a database binary file format representing planar geometric shapes, text labels, and other information about a circuit layout in a hierarchical format, such as a Graphic Data System (GDSII) file format. The design computer 1414 may be configured to generate a data file including the transformed design information, such as a GDSII file 1426 that includes information describing a TSV wafer that includes an electrostatic discharge diode at a back-side of a substrate (e.g., the TSV wafer illustrated in FIGS. 1-10 and/or a TSV wafer formed according to the methods 1100-1200 of FIGS. 11-12) in addition to other circuits or information. To illustrate, the data file may include information corresponding to a system-on-chip (SOC) that includes a TSV wafer that includes an electrostatic discharge diode at a back-side of a substrate (e.g., the TSV wafer illustrated in FIGS. 1-10 and/or a TSV wafer formed according to the methods 1100-1200 of FIGS. 11-12), and that also includes additional electronic circuits and components within the SOC.

The GDSII file 1426 may be received at a fabrication process 1428 to manufacture a TSV wafer that includes an electrostatic discharge diode at a back-side of a substrate (e.g. the TSV wafer illustrated in FIGS. 1-10 and/or a TSV wafer formed according to methods 1100-1200 of FIGS. 11-12), according to transformed information in the GDSII file 1426. For example, a device manufacture process may include providing the GDSII file 1426 to a mask manufacturer 1430 to create one or more masks, such as masks to be used with photolithography processing, illustrated as a representative mask 1432. The mask 1432 may be used during the fabrication process to generate one or more wafers 1434, which may be tested and separated into dies, such as a representative die 1436. The die 1436 includes a TSV wafer that includes an electrostatic discharge diode at a back-side of a substrate (e.g., the TSV wafer illustrated in FIGS. 1-10 and/or a TSV wafer formed according to the methods 1100-1200 of FIGS. 11-12).

In conjunction with the described embodiments, a non-transitory computer-readable medium stores instructions executable by a computer to perform the method 1100 of FIG. 11, the method 1200 of FIG. 12, or any combination thereof. For example, equipment of a semiconductor manufacturing plant may include a computer and a memory and may perform the method 1100 of FIG. 11, the method 1200 of FIG. 12, or any combination thereof, such as in connection with the fabrication process 1428 and using the GSDII file 1426. To illustrate, the computer may execute instructions to initiate thinning a back-side of a substrate to expose a portion of a first via that is formed in the substrate and to initiate forming a first diode at the back-side of the substrate, as described with reference to FIG. 11.

The die 1436 may be provided to a packaging process 1438 where the die 1436 is incorporated into a representative package 1440. For example, the package 1440 may include the single die 1436 or multiple dies, such as a system-in-package (SiP) arrangement. The package 1440 may be configured to conform to one or more standards or specifications, such as Joint Electron Device Engineering Council (JEDEC) standards.

Information regarding the package 1440 may be distributed to various product designers, such as via a component library stored at a computer 1446. The computer 1446 may include a processor 1448, such as one or more processing cores, coupled to a memory 1450. A printed circuit board (PCB) tool may be stored as processor executable instructions at the memory 1450 to process PCB design information 1442 received from a user of the computer 1446 via a user interface 1444. The PCB design information 1442 may include physical positioning information of a packaged semiconductor device on a circuit board, the packaged semiconductor device corresponding to the package 1440 including a TSV wafer that includes an electrostatic discharge diode at a back-side of a substrate (e.g., the TSV wafer illustrated in FIGS. 1-10 and/or a TSV wafer formed according to the methods 1100-1200 of FIGS. 11-12).

The computer 1446 may be configured to transform the PCB design information 1442 to generate a data file, such as a GERBER file 1452 with data that includes physical positioning information of a packaged semiconductor device on a circuit board, as well as layout of electrical connections such as traces and vias, where the packaged semiconductor device corresponds to the package 1440 including a TSV wafer that includes an electrostatic discharge diode at a back-side of a substrate (e.g., the TSV wafer illustrated in FIGS. 1-10 and/or a TSV wafer formed according to the methods 1100-1200 of FIGS. 11-12). In other embodiments, the data file generated by the transformed PCB design information may have a format other than a GERBER format.

The GERBER file 1452 may be received at a board assembly process 1454 and used to create PCBs, such as a representative PCB 1456, manufactured in accordance with the design information stored within the GERBER file 1452. For example, the GERBER file 1452 may be uploaded to one or more machines to perform various steps of a PCB production process. The PCB 1456 may be populated with electronic components including the package 1440 to form a representative printed circuit assembly (PCA) 1458.

The PCA 1458 may be received at a product manufacture process 1460 and integrated into one or more electronic devices, such as a first representative electronic device 1462 and a second representative electronic device 1464. As an illustrative, non-limiting example, the first representative electronic device 1462, the second representative electronic device 1464, or both, may be selected from the group of a cellular phone, a wireless local area network (LAN) device, a set top box, a music player, a video player, an entertainment unit, a navigation device, a communications device, a personal digital assistant (PDA), a fixed location data unit, and a computer, into which a TSV wafer that includes an electrostatic discharge diode at a back-side of a substrate (e.g. the TSV wafer illustrated in FIGS. 1-10 and/or a TSV wafer formed according to the methods 1100-1200 of FIGS. 11-12) is integrated. As another illustrative, non-limiting example, one or more of the electronic devices 1462 and 1464 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 13 illustrates remote units according to teachings of the disclosure, the disclosure is not limited to these illustrated units. Embodiments of the disclosure may be suitably employed in any device which includes active integrated circuitry including memory and on-chip circuitry.

A device that includes a TSV wafer that includes an electrostatic discharge diode at a back-side of a substrate (e.g., the TSV wafer illustrated in FIGS. 1-10 and/or a TSV wafer formed according to the methods 1100-1200 of FIGS. 11-12) may be fabricated, processed, and incorporated into an electronic device, as described in the illustrative process 1400. One or more aspects of the embodiments disclosed with respect to FIGS. 1-10 may be included at various processing stages, such as within the library file 1412, the GDSII file 1426, and the GERBER file 1452, as well as stored at the memory 1410 of the research computer 1406, the memory 1418 of the design computer 1414, the memory 1450 of the computer 1446, the memory of one or more other computers or processors (not shown) used at the various stages, such as at the board assembly process 1454, and also incorporated into one or more other physical embodiments such as the mask 1432, the die 1436, the package 1440, the PCA 1458, other products such as prototype circuits or devices (not shown), or any combination thereof. Although various representative stages are depicted with reference to FIGS. 1-12 to form electrostatic discharge diodes at a back-side of a TSV wafer, in other embodiments fewer stages may be used or additional stages may be included. Similarly, the process 1400 of FIG. 14 may be performed by a single entity or by one or more entities performing various stages of the process 1400.

In conjunction with the described embodiments, an apparatus is disclosed that includes means for sinking electrostatic charges having a negative polarity into a substrate of a through-silicon-via (TSV) wafer. The means for sinking the electrostatic charges having the negative polarity may be located at a back-side of the substrate. For example, the means for sinking electrostatic charges having the negative polarity may include the first diode 132 of the TSV wafer depicted in FIGS. 1-10.

The apparatus also includes means for sinking electrostatic charges having a positive polarity into the substrate. The means for sinking the electrostatic charges having the positive polarity located at the back-side of the substrate. The means for sinking electrostatic charges having the positive polarity may include the second diode 128 of the TSV wafer depicted in FIGS. 1-10.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
a substrate;
a first via that extends from a back-side of the substrate; and
a first diode at the back-side of the substrate, wherein the first diode is coupled to the first via and the first diode is configured to sink electrostatic charges into the substrate;
a second via that extends from the back-side of the substrate; and
a second diode at the back-side of the substrate, wherein the second diode is formed by a redistribution layer contacting a semiconductor material coupled to the second via, and wherein the second diode is coupled to the second via and the second diode is configured to sink electrostatic charges into the substrate.

2. The device of claim 1, further comprising an isolation layer deposited on the substrate, wherein the redistribution layer is located over the isolation layer, and wherein the first diode is formed by way of the redistribution layer contacting the substrate in an opening of the isolation layer.

3. The device of claim 2, wherein the isolation layer includes one or more of silicon dioxide ($SiO_2$), silicon nitride ($Si_3N_4$), silicon oxynitride (SiOxNy), tantalum pentoxide ($Ta_2O_5$), aluminum oxide ($Al_2O_3$), aluminum nitride (AlN), or a polymeric insulator.

4. The device of claim 2, wherein the redistribution layer includes one or more of aluminum (Al), copper (Cu), silver (Ag), or tungsten (W).

5. The device of claim 1, wherein the semiconductor material comprises one or more of indium oxide ($In_2O_3$) or indium tin oxide (ITO).

6. The device of claim 5, wherein the first via and the second via are metal-filled vias.

7. The device of claim 6, wherein the metal comprises one or more of copper (Cu), tungsten (W), silver (Ag), or gold (Au).

8. The device of claim 1, wherein the substrate includes a p-type implantable substrate.

9. The device of claim 1, wherein the substrate is a silicon substrate.

10. A non-transitory computer-readable medium comprising instructions that, when executed by a processor, cause the processor to:
initiate thinning a back-side of a substrate to expose a portion of a first via that is formed in the substrate;
initiate forming a first diode at the back-side of the substrate, wherein the first diode is coupled to the first via;
initiate patterning an opening in an isolation layer deposited on the back-side of the substrate, wherein the opening contacts the substrate; and
initiate depositing a redistribution layer in the opening, wherein the first diode is formed based on the redistribution layer contacting the substrate in the opening.

11. The non-transitory computer-readable medium of claim 10, wherein the processor is integrated into an electronic device.

12. A non-transitory computer-readable medium comprising instructions that, when executed by a processor, cause the processor to:
initiate thinning a back-side of a substrate to expose a portion of a first via that is formed in the substrate, wherein thinning the back-side of the substrate further exposes a portion of a second via that is formed in the substrate; and
initiate forming a first diode at the back-side of the substrate, wherein the first diode is coupled to the first via.

13. The non-transitory computer-readable medium of claim 12, further comprising instructions that, when executed by the processor, cause the processor to:
initiate depositing an n-type semiconductor material on the second via; and
initiate depositing a redistribution layer on the n-type semiconductor material, wherein a second diode is formed based on the redistribution layer contacting the n-type semiconductor material.

* * * * *

UNITED STATES PATENT AND TRADEMARK OFFICE
CERTIFICATE OF CORRECTION

| | | |
|---|---|---|
| PATENT NO. | : 9,093,462 B2 | Page 1 of 1 |
| APPLICATION NO. | : 13/887723 | |
| DATED | : July 28, 2015 | |
| INVENTOR(S) | : Vidhya Ramachandran et al. | |

It is certified that error appears in the above-identified patent and that said Letters Patent is hereby corrected as shown below:

In the Claims section, Column 13, Claim 1, Line 61, "of the substrate; and" should read --of the substrate;--.

Signed and Sealed this
Fifth Day of January, 2016

Michelle K. Lee
*Director of the United States Patent and Trademark Office*